(12) United States Patent
Xue et al.

(10) Patent No.: US 10,700,788 B2
(45) Date of Patent: Jun. 30, 2020

(54) METHOD AND APPARATUS FOR COMPENSATING FOR WAVELENGTH DRIFT

(71) Applicant: WUHAN TELECOMMUNICATION DEVICES CO., LTD., Wuhan (CN)

(72) Inventors: Zhenfeng Xue, Wuhan (CN); Yongan Fu, Wuhan (CN); Liping Sun, Wuhan (CN); Jun Zhang, Wuhan (CN); Yaping Lv, Wuhan (CN); Ting Gao, Wuhan (CN); Chao Luo, Wuhan (CN); Chaoqun Wu, Wuhan (CN)

(73) Assignee: WUHAN TELECOMMUNICATION DEVICES CO., LTD., Wuhan (CN)

( * ) Notice: Subject to any disclaimer, the term of this patent is extended or adjusted under 35 U.S.C. 154(b) by 0 days.

(21) Appl. No.: 16/283,903

(22) Filed: Feb. 25, 2019

(65) Prior Publication Data

US 2019/0190615 A1    Jun. 20, 2019

Related U.S. Application Data

(63) Continuation of application No. PCT/CN2016/110320, filed on Dec. 16, 2016.

(30) Foreign Application Priority Data

Aug. 26, 2016    (CN) .......................... 2016 1 0742113

(51) Int. Cl.
*H04B 10/572*    (2013.01)
*H01S 5/0683*    (2006.01)
(Continued)

(52) U.S. Cl.
CPC ......... *H04B 10/572* (2013.01); *H01S 3/0675* (2013.01); *H01S 5/06835* (2013.01);
(Continued)

(58) Field of Classification Search
CPC .... H04B 10/572; H04B 10/272; H04B 10/50; H01S 3/067; H01S 5/0683; H01S 3/0675;
(Continued)

(56) References Cited

U.S. PATENT DOCUMENTS 6,950,450 B2 * 9/2005 Simsarian ............... H01S 5/042
372/20
7,853,154 B2 * 12/2010 Ikram .................. H04B 10/564
372/38.02

(Continued)

FOREIGN PATENT DOCUMENTS

CN    1359178 A    7/2002
CN    102252982 A * 11/2011 ............. G01N 21/01
(Continued)

OTHER PUBLICATIONS

High extinction switching of SOAs for in-band crosstalk reduction in PON, Electronics letters, Jul. 3, 2008, vol. 44 No. 14.
(Continued)

*Primary Examiner* — Abbas H Alagheband
(74) *Attorney, Agent, or Firm* — IPro, PLLC

(57) ABSTRACT

A method and an apparatus for compensating for wavelength drift are disclosed. The method includes: generating, by a burst control circuit, a burst bias current; sending, by the burst control circuit, the burst bias current to a light emitting part and a trigger; converting, by the trigger, the received burst bias current into burst DA data; sending, by the trigger, the burst DA data to a synthesizer circuit; receiving, by the synthesizer circuit, the burst DA data sent by the trigger and the calibrated DA data sent by the MCU respectively; synthesizing, by the synthesizer circuit, the burst DA data and the calibrated DA data to obtain a synthesized signal; and sending, by the synthesizer circuit, the synthesized signal to a temperature control part.

15 Claims, 5 Drawing Sheets

(51) Int. Cl.
  *H04B 10/272* (2013.01)
  *H01S 3/067* (2006.01)
  *H04J 14/02* (2006.01)
  *H01S 5/024* (2006.01)
  *H01S 5/06* (2006.01)
(52) U.S. Cl.
  CPC ....... *H01S 5/06837* (2013.01); *H04B 10/272* (2013.01); *H04J 14/0236* (2013.01); *H01S 5/02415* (2013.01); *H01S 5/0617* (2013.01)
(58) Field of Classification Search
  CPC ............. H01S 5/06835; H01S 5/06837; H01S 5/02415; H01S 5/0617; H01S 5/042; H04J 14/02; H04J 14/0236
  USPC .......................................................... 398/43
  See application file for complete search history.

(56) References Cited

U.S. PATENT DOCUMENTS

| | | | |
|---|---|---|---|
| 9,722,708 B2* | 8/2017 | Sarashina | H04J 14/0282 |
| 9,912,116 B2* | 3/2018 | Asaka | H01S 5/042 |
| 2002/0027690 A1* | 3/2002 | Bartur | H04B 10/504 |
| | | | 398/139 |
| 2009/0010435 A1* | 1/2009 | Zbinden | H04B 10/70 |
| | | | 380/256 |
| 2014/0341593 A1* | 11/2014 | van Veen | H04B 10/272 |
| | | | 398/201 |
| 2015/0188627 A1* | 7/2015 | Yuda | H04B 10/541 |
| | | | 398/30 |
| 2016/0111856 A1* | 4/2016 | Yan | H01S 5/0612 |
| | | | 372/34 |
| 2017/0365980 A1* | 12/2017 | Pfeiffer | H01S 5/0617 |
| 2018/0183525 A1* | 6/2018 | Capriata | H04B 10/2507 |

FOREIGN PATENT DOCUMENTS

| | | |
|---|---|---|
| CN | 102252982 A | 11/2011 |
| CN | 102752055 A | 10/2012 |
| CN | 103594923 A | 2/2014 |
| EP | 1215832 A2 | 6/2002 |

OTHER PUBLICATIONS

International Search Report dated May 4, 2017; PCT/CN2016/110320.
Office Action dated May 3, 2018; CN 2016107421138.

* cited by examiner

METHOD AND APPARATUS FOR COMPENSATING FOR WAVELENGTH DRIFT

CROSS-REFERENCE TO RELATED APPLICATIONS

This application is a continuation of International Application No. PCT/CN2016/110320, with an international filing date of Dec. 16, 2016, which is based upon and claims priority to Chinese Patent Application No. 201610742113.8, filed on Aug. 26, 2016, titled "METHOD AND APPARATUS FOR COMPENSATING FOR WAVELENGTH DRIFT," the entire contents of which are incorporated herein by reference.

TECHNICAL FIELD

The present disclosure relates to the technical field of optical communications, and in particular, relates to a method and apparatus for compensating for a wavelength drift.

BACKGROUND

Demands on the information transmission bandwidths are always in an explosive growth rate. To accommodate the rapid development of network traffics, in backbone networks, 40 Gbps and 100 Gbps optical networks start deployments for commercial use, and 400 Gbps or 1 Tbps optical communication systems are under research and development. With respect to the access network, higher requirements would be definitely imposed on network traffic and multi-service support. At present, the access network is mainly based on the tree-structured passive optical network (PON), and the time division multiplexing-passive optical network (TDM-PON) is extensively applied. The Ethernet passive optical network (EPON) and the Gigabit-capable passive optical network (GPON) are mainstream means for network instruction of current Fiver To The Home (FTTH). However, neither the EPON nor the GPON accommodates the requirements on information rate imposed by the access network. Therefore, a next-generation PON technology has been widely concerned in the industry.

It is considered in the industry that the NG-PON may evolve towards three aspects: 1) single wavelength rate increase; 2) wave division multiplexing; and 3) orthogonal frequency division multiplexing. Technologies in the above three aspects may all effectively solve the bottleneck of bandwidth in the future market. However, in these technologies, some difficulties also need to be solved. For example, increasing the single wavelength rate may inevitably cause greater line dispersion. The orthogonal frequency division multiplexing imposes new requirements on digital signal process (DSP). Comparatively, the wave division multiplexing may be more easily implemented, the technical barrier is small and the cost is low. Accordingly, the Full Service Access network (FSAN) Summit finally determines the time- and wavelength-division multiplexed passive optical network (TWDM-PON) as a final solution of the next-generation PON products.

However, even the TWDM-PON likewise has some technical problems to be urgently solved. That is, wavelength division and time division functions are also implemented at the transmitter end of an ONU module, which is fresh in the access network. In the case of burst turn-on of a light source, since the chip has a high temperature and a variable refractive index, redshift of the operating wavelength occurs at the instant of burst turn-on. Since the dense wavelength division multiplexing (DWDM) system has a wavelength interval of generally 2000 G, 100 G or 50 G. Such redshift of the wavelength causes the optical signal to be transmitted into adjacent DWDM channels to form crosstalk, thereby lowering the communication quality.

With respect to this problem, literatures such as "High extinction switching of SOAs for in-band crosstalk reduction in PON" in Electronics letters published on Jul. 3, 2008 has proposed a service-oriented architecture (SOA) is integrated before a transmit DWDM laser, and the SOA is used as a burst unit. In this way, in the case of burst, the laser does not need to be turned on or turned off. This prevents impacts caused to the operating state or the operating wavelength of the laser in the case of burst.

SUMMARY

An embodiment of the present disclosure provides a method for compensating for a wavelength drift, wherein Micro Controller Unit (MCU) stores calibrated Digit Analogy (DA) data. The method includes:
generating, by a burst control circuit, a burst bias current;
sending, by the burst control circuit, the burst bias current to a light emitting part and a trigger;
converting, by the trigger, the received burst bias current into burst DA data;
sending, by the trigger, the burst DA data to a synthesizer circuit;
receiving, by the synthesizer circuit, the burst DA data sent by the trigger and the calibrated DA data sent by the MCU respectively;
synthesizing, by the synthesizer circuit, the burst DA data and the calibrated DA data to obtain a synthesized signal; and
sending, by the synthesizer circuit, the synthesized signal to a temperature control part.

Another embodiment of the present disclosure provides a method for compensating for a wavelength drift, wherein a Micro Controller (MCU) stores calibrated Digit Analogy (DA) data. The method includes:
generating, by a burst control circuit, a burst bias current;
sending, by a burst control circuit, the burst bias current to a light emitting part;
receiving, by a trigger, a feedback signal from the light emitting part;
converting, by the trigger, the feedback signal into feedback DA data;
sending, by a trigger, the feedback DA data to a synthesizer circuit;
receiving, by the synthesis circuit, the feedback DA data sent by the trigger and the calibrated DA data sent by the MCU respectively;
synthesizing, by the synthesis circuit, the feedback DA data and the calibrated DA data to obtain a synthesized signal; and
sending, by the synthesis circuit, the synthesized signal to a temperature control part.

Still another embodiment of the present disclosure provides an apparatus for compensating for a wavelength drift. The apparatus includes: a burst control circuit, a light emitting part, an Micro Controller (MCU), a trigger, a synthesizer circuit and a temperature control part; wherein the burst control circuit is connected to the light emitting part, an input terminal and an output terminal of the trigger are respectively connected to the burst control circuit and the synthesizer circuit, an input terminal of the synthesizer circuit is connected to the MCU and the trigger, and an output terminal of the synthesizer circuit is connected to the temperature control part;

wherein the burst control circuit is configured to send a burst bias current to the light emitting part; the MCU is configured to store and output calibrated data; the trigger is configured to receive a burst signal and output a corresponding compensation signal under trigger of the burst signal; the synthesizer circuit is configured to synthesize calibrated Digit Analogy (DA) data and burst DA data to obtain a synthesized signal, and output the synthesized signal to the temperature control part; and the temperature control part is configured to receive an output signal upon systemization by the synthesizer circuit, and control a temperature of the light emitting part, such that wavelength redshift caused by burst turn-on and wavelength blueshift caused by burst turn-off are compensated.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

DETAILED DESCRIPTION

For clear description of objectives, technical solutions, and advantages of the present disclosure, the present disclosure is further described in detail below by reference to the embodiments and the accompanying drawings. It should be understood that the embodiments described here are only exemplary ones for illustrating the present disclosure, and are not intended to limit the present disclosure.

In the description of the present disclosure, it should be understood that the terms "inner", "outer", "internal", "external", "transversal", "longitudinal", "upper", "lower", "top", "bottom" and the like indicate orientations and position relationships which are based on the illustrations in the accompanying drawings, and these terms are merely for ease and brevity of the description, instead of indicating or implying that the devices or elements shall have particular orientations and shall be structured and operated based on the particular orientations. Accordingly, these terms shall not be construed as limiting the present disclosure.

In addition, technical features involved in various embodiments of the present disclosure described hereinafter may be combined as long as these technical features are not in conflict.

Embodiment 1

Figure 1:
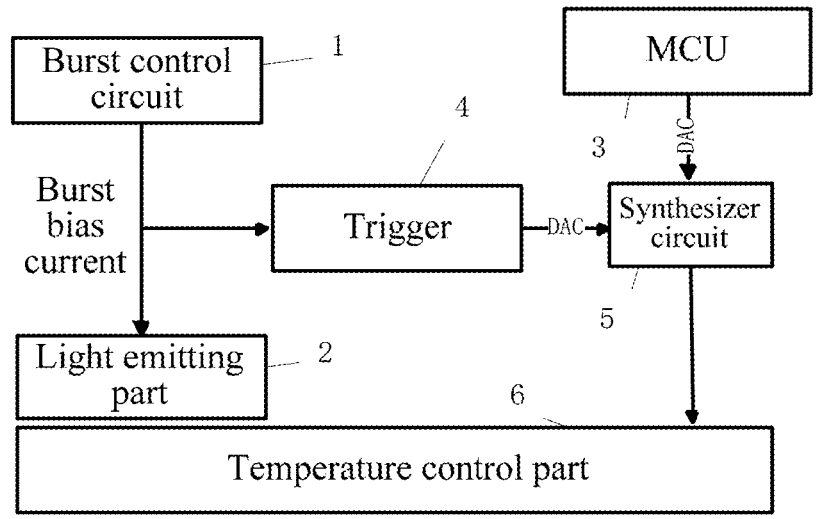
FIG. 1 is a schematic structural diagram of an apparatus for compensating for a wavelength drift according to an embodiment of the present disclosure.

The embodiment of the present disclosure provides an apparatus for compensating for a wavelength drift. As illustrated in FIG. 1, the apparatus includes a burst control circuit 1, a light emitting part 2, an Micro Controller (MCU) 3, a trigger 4, a synthesizer circuit 5 and a temperature control part 6; wherein the burst control circuit 1 is connected to the light emitting part 2, an input terminal and an output terminal of the trigger 4 are respectively connected to the burst control circuit 1 and the synthesizer circuit 5, an input terminal of the synthesizer circuit 5 is connected to the MCU 3 and the trigger 4, and an output terminal of the synthesizer circuit 5 is connected to the temperature control part 6.

The burst control circuit 1 is configured to send a burst bias current to the light emitting part 2; the MCU 3 is configured to store and output calibrated data; the trigger 4 is configured to receive a burst signal and output a corresponding compensation signal under trigger of the burst signal; the synthesizer circuit 5 is configured to synthesize calibrated digit analogy (DA) data and burst DA data to obtain a synthesized signal, and output the synthesized signal to the temperature control part 6; the temperature control part 6 is configured to receive an output signal upon systemization by the synthesizer circuit 5, and control a temperature of the light emitting part 2, such that wavelength redshift caused by burst turn-on and wavelength blueshift caused by burst turn-off are compensated.

Figure 2:
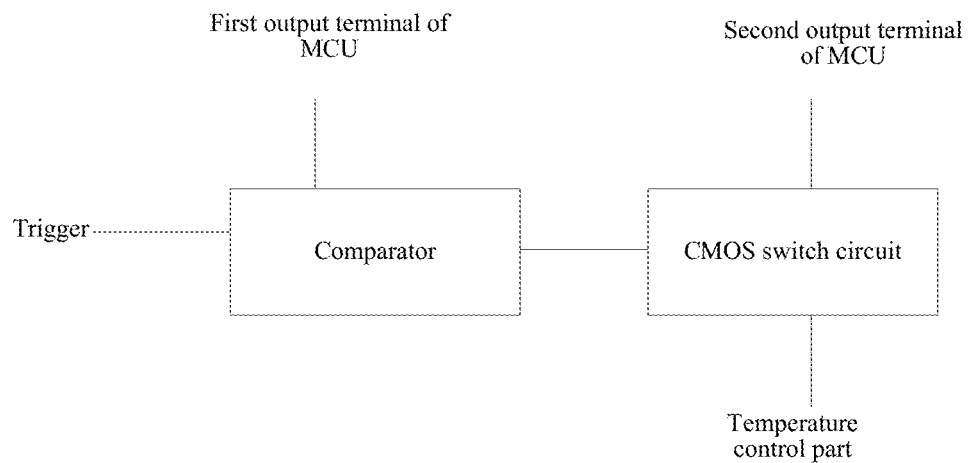
FIG. 2 is a schematic structural diagram of a synthesizer circuit in an apparatus for compensating for a wavelength drift according to an embodiment of the present disclosure.

The embodiment of the present disclosure employs a MCU 3 chip. With respect to a high speed laser, the traditional processing may not effectively quickly generate a synthesized signal after generating a burst bias current. Therefore, for the same of a desired speed of generating the synthesized signal, in combination with a possible implementation solution according to the embodiment of the present disclosure, as illustrated in FIG. 2, the synthesizer circuit 5 includes:

a comparator including an integrated amplifier, wherein two input terminals of the comparator are respectively connected to the output terminal of the trigger 4 and a first output terminal of the MCU 3; and an output terminal of the comparator is connected to a switch control electrode of a Complementary Metal-Oxide-Semiconductor (CMOS) switch circuit, wherein a data input terminal of the CMOS switch circuit is connected to a second output terminal of the MCU 3, and a data output terminal of the CMOS switch circuit is connected to the temperature control part 6;

wherein the first output terminal is configured to output a comparison parameter in the calibrated DA data, and the second output terminal is configured to output a correction parameter in the calibrated DA data.

If a comparison parameter in the calibrated DA data is different from the burst DA data, the comparator outputs a low level to a switch control electrode of the CMOS switch circuit, whereupon a CMOS switch is in a turned-off state, and a data input terminal and the data output terminal of the CMOS switch circuit are turned off.

if the comparison parameter in the calibrated DA data is the same as the burst DA data, outputting, by the comparator, a high level to the switch control electrode of the CMOS switch circuit, whereupon the CMOS switch is in a turned-on state and the data input terminal and the data output terminal of the CMOS switch circuit are turned on, and whereupon the calibration parameter in the calibrated DA data is transferred to the temperature control part 6 via the data input terminal and the data output terminal of the CMOS switch circuit; wherein the synthesized signal in Embodiment 1 may be specifically the correction parameter in the calibrated DA data transferred by the data output terminal of the CMOS switch circuit in this optional solution.

In the embodiment of the present disclosure, the light emitting part 2 is a narrowband laser for use in a dense wavelength division multiplexing (DWDM) system, including a Distributed Feedback (DFB) laser, an Electro-absorption Modulated (EML) laser or a Distributed Bragg Reflector (DBR) laser. The narrowband laser is a semiconductor laser whose operating wavelength depends on application requirements of the system. The semiconductor laser is essentially sensitive to temperature. Therefore, when the bias current thereof is controlled to burst, the temperature rises in the case of burst turn-on and falls in the case of burst turn-off, which results in a drift of the operating wavelength. Specifically, wavelength redshift occurs in the case of burst turn-on and wavelength blueshift occurs in the case of burst turn-off. The redshift amount and the blueshift amount are slightly different depending on different chip designs and burst amplitudes. However, the shift may definitely causes crosstalk to signals on adjacent channels.

Figure 8:
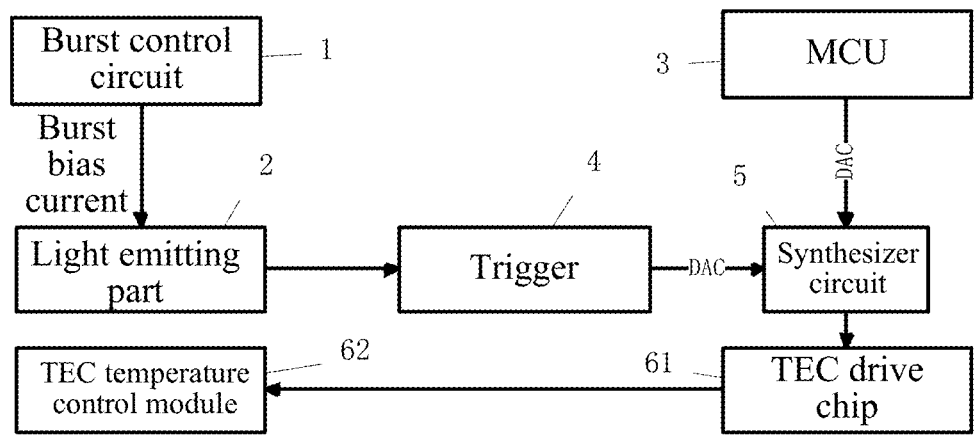
FIG. 8 is a schematic structural diagram of an apparatus for compensating for a wavelength drift according to an embodiment of the present disclosure.

In the embodiment of the present disclosure, the temperature control part 6 includes a Thermoelectric Cooler (TEC) control chip 61 and a TEC temperature control module 62 (reference may be made to the schematic structural diagram in FIG. 8).

In the embodiment of the present disclosure, the trigger is most simply practiced as a DA converter.

Embodiment 2

Figure 3:
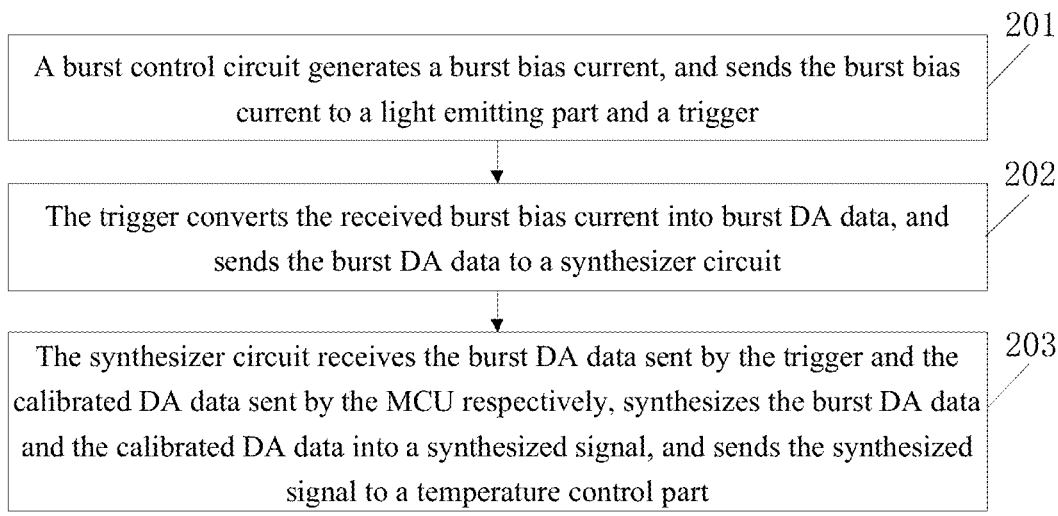
FIG. 3 is a schematic flowchart of a method for compensating for a wavelength drift according to an embodiment of the present disclosure.

The embodiment of the present disclosure provides a method for compensating for a wavelength drift. The method is applicable to the apparatus for compensating for a wavelength drift according to Embodiment 1. In the embodiment, an MCU 3 stores calibrated DA data. As illustrated in FIG. 3, the method includes the following steps:

In step 201, a burst control circuit 1 generates a burst bias current, and sends the burst bias current to a light emitting part 2 and a trigger 4.

In step 202, the trigger 4 converts the received burst bias current into burst DA data, and sends the burst DA data to a synthesizer circuit 5.

In step 203, the synthesizer circuit 5 receives the burst DA data sent by the trigger 4 and the calibrated DA data sent by the MCU 3 respectively, synthesizes the burst DA data and the calibrated DA data into a synthesized signal, and sends the synthesized signal to a temperature control part 6.

In the embodiment of the present disclosure, temperature variations and wavelength drifts of the light emitting part 2 in the case of bursts are compensated by the circuit; wherein the bias current of a burst signal is used as a compensation signal which is not stored and parsed by the MCU 3. Therefore, less time is desired, and thus the temperature variations and wavelength drifts generated at the instant of the bursts may be more quickly compensated. In this way, the time cost is low, and the link communication is not affected.

Figure 4:
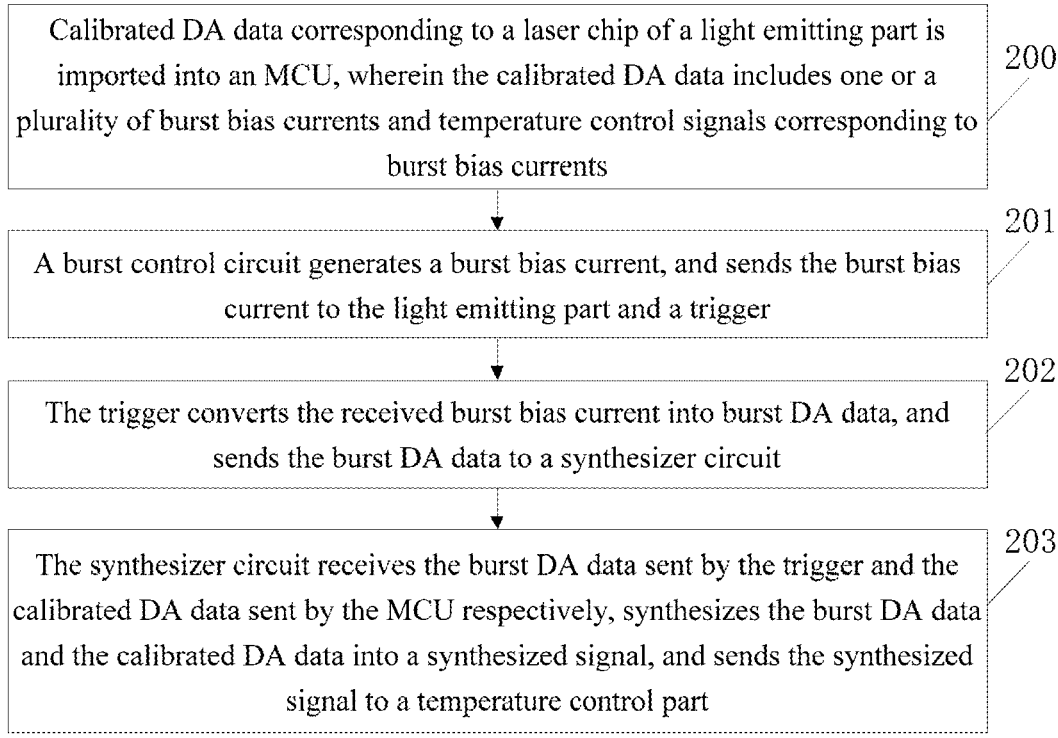
FIG. 4 is a schematic flowchart of a method for compensating for a wavelength drift according to an embodiment of the present disclosure.

In the embodiment of the present disclosure, the MCU 3 stores calibrated DA data, which may be specifically practiced by step 200. As illustrated in FIG. 4, the storing the calibrated DA data may be specifically as follows:

In step 200, calibrated DA data corresponding to a laser chip of the light emitting part 3 is imported into the MCU 3, wherein the calibrated DA data includes one or a plurality of burst bias currents and temperature control signals corresponding to the burst bias currents.

Figure 5:
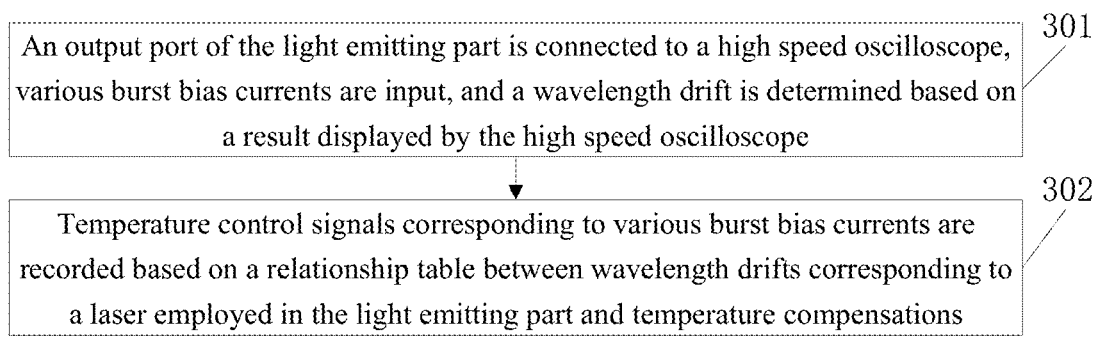
FIG. 5 is a schematic flowchart of a method for compensating for a wavelength drift according to an embodiment of the present disclosure.

In combination with the embodiment of the present disclosure, a method for acquiring the calibrated DA data is also provided. As illustrated in FIG. 5, the method specifically includes the following steps:

In step 301, an output port of the light emitting part 2 is connected to a high speed oscilloscope, various burst bias currents are input, and a wavelength drift is determined based on a result displayed by the high speed oscilloscope.

In step 302, temperature control signals corresponding to various burst bias currents are recorded based on a relationship table between wavelength drifts corresponding to a laser employed in the light emitting part and temperature compensations.

Embodiment 3

Figure 6:
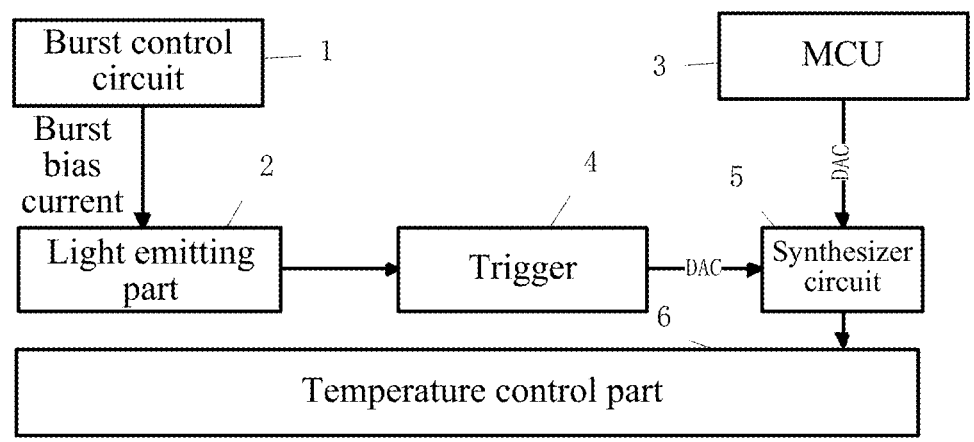
FIG. 6 is a schematic structural diagram of an apparatus for compensating for a wavelength drift according to an embodiment of the present disclosure.

The embodiment of the present disclosure provides an apparatus for compensating for a wavelength drift. As illustrated in FIG. 6, the apparatus includes a burst control circuit 1, a light emitting part 2, an MCU 3, a trigger 4, a synthesizer circuit 5 and a temperature control part 6; wherein the burst control circuit 1 is connected to the light emitting part 2, an input terminal and an output terminal of the trigger 4 are respectively connected to the light emitting part 2 and the synthesizer circuit 5, an input terminal of the synthesizer circuit 5 is connected to the MCU 3 and the trigger 4, and an output terminal of the synthesizer circuit 5 is connected to the temperature control part 6.

The burst control circuit 1 is configured to send a burst bias current to the light emitting part; the MCU 3 is configured to store and output calibrated data; a backlight feedback circuit of the light emitting part 2 forms a burst feedback signal, wherein a feedback rising edge signal or falling edge signal is input to the trigger 4; the trigger 4 is configured to convert the feedback signal into feedback DA data; the synthesizer circuit 5 is configured to synthesize calibrated DA data and feedback DA data to obtain a synthesized signal, and output the synthesized signal to the temperature control part 6; the temperature control part 6 is configured to receive an output signal upon systemization by the synthesizer circuit 5, and control a temperature of the light emitting part 2, such that wavelength redshift caused by burst turn-on and wavelength blueshift caused by burst turn-off are compensated.

As compared with Embodiment 1, the embodiment is different in that the signal received by the trigger is from the light emitting part, instead of the burst control circuit in Embodiment 1. As compared with Embodiment 1, the apparatus in the embodiment has poor prediction capabilities. However, the embodiment is more suitable for complicated operating environments. The calibrated DA data acquired by tests may not accurately suitable for complicated environments.

It should be emphasized that based on the same inventive concept, improvement methods and practice details of various modules in the embodiment may be referenced to the disclosure in Embodiment 1, which are thus not exhaustively described herein.

Embodiment 4

Figure 7:
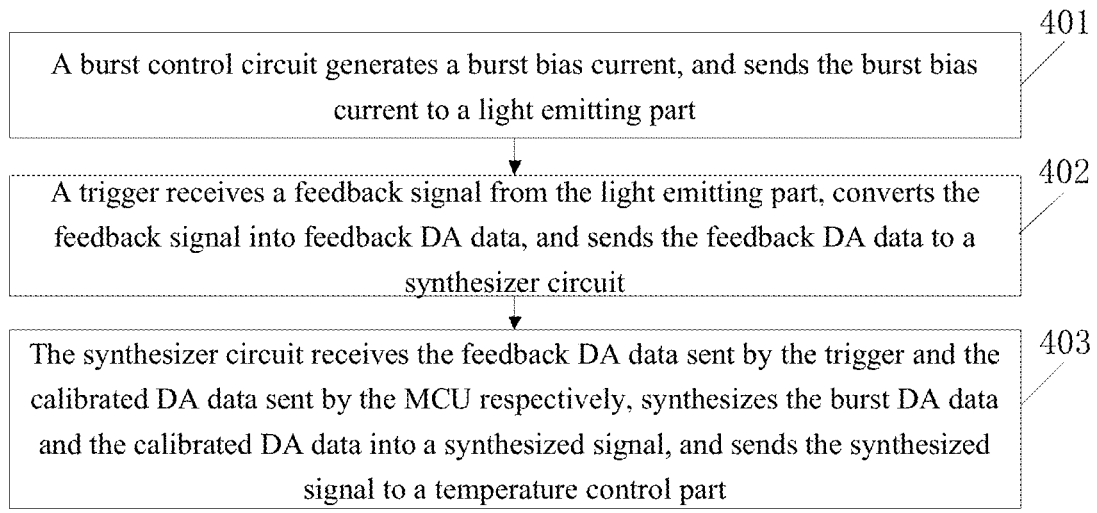
FIG. 7 is a schematic flowchart of a method for compensating for a wavelength drift according to an embodiment of the present disclosure.

The embodiment of the present disclosure further provides a method for compensating for a wavelength drift. The method is applicable to the apparatus for compensating for a wavelength drift according to Embodiment 3. In the method according to the embodiment, an MCU 3 stores calibrated DA data. As illustrated in FIG. 7, the method includes the following steps:

In step 401, a burst control circuit 1 generates a burst bias current, and sends the burst bias current to a light emitting part 2.

In step 402, a trigger receives a feedback signal from the light emitting part 2, converts the feedback signal into feedback DA data, and sends the feedback DA data to a synthesizer circuit 5.

In step 403, the synthesizer circuit 5 receives the feedback DA data sent by the trigger 4 and the calibrated DA data sent by the MCU 3 respectively, synthesizes the burst DA data and the calibrated DA data into a synthesized signal, and sends the synthesized signal to a temperature control part 6.

In the embodiment of the present disclosure, temperature variations and wavelength drifts of the light emitting part 2 in the case of bursts are compensated by the circuit; wherein the bias current of a burst signal is used as a compensation signal which is not stored and parsed by the MCU 3. Therefore, less time is desired, and thus the temperature variations and wavelength drifts generated at the instant of the bursts may be more quickly compensated. In this way, the time cost is low, and the link communication is not affected.

As compared with Embodiment 2, the embodiment is different in that the signal received by the trigger is from the light emitting part, instead of the burst control circuit in Embodiment 2. As compared with Embodiment 2, the apparatus in the embodiment has poor prediction capabilities. However, the embodiment is more suitable for complicated operating environments. The calibrated DA data acquired by tests may not accurately suitable for complicated environments.

Embodiment 5

The embodiment of the present disclosure further illustrates the temperature control part 6 according to Embodiments 1 to 3. The temperature control part 6 includes a heating part (for example, TEC), wherein the heating part and the light emitting part 2 are closely contacted, and good thermal conduction is ensured, such that the temperature of the light emitting part 2 may be adjusted when the environmental temperatures varies. In this way, the temperature control part is ensured to operate within the operating wavelength to adjust the temperature of the light emitting part 2 within a specific range, to ensure that the light emitting part 2 has a stable operating wavelength under different environmental temperatures.

Embodiment 6

The embodiment of the present disclosure further illustrates how signals are transferred between the light emitting part 2 in Embodiments 3 and 4 and a trigger 4, and the specific conversion process of feedback DA data, and further provides an implementation manner of the synthesizer circuit. Referring to the schematic structural diagram in FIG. 8, illustration is given as follows:

The light emitting part 2 has a backlight single-side chip, wherein the backlight single-side chip practices feedback of a burst signal based on bias current variations. A feedback rising edge signal (in the case of burst turn-on) or falling edge signal (in the case of burst turn-off) is input and output to the trigger. The trigger 4 triggers corresponding output feedback DA data. A synthesizer circuit 5 performs an add or subtract operation based on the feedback DA data and the calibrated DA data sent by an MCU 3, and then output a result to a TEC drive chip 61. The TEC drive chip 61 outputs a control circuit to a TEC temperature control module 62 based on an input DA signal value to adjust the temperature of the light emitting part 2. In this way, in the temperature variations and wavelength drifts in the case of burst are compensated.

Embodiment 7

Figure 9:
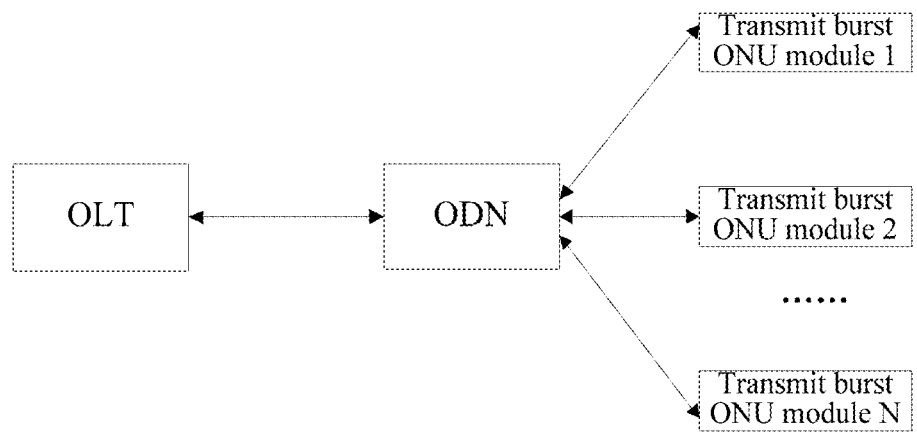
FIG. 9 is a schematic diagram of architecture applicable to an apparatus for compensating for a wavelength drift according to an embodiment of the present disclosure.

The embodiment of the present disclosure uses time- and wavelength-division multiplexed passive optical network (TWDM-PON). As illustrated in FIG. 9, in application of the TWDM-PON, an upstream wavelength input from an optical network unit (ONU) is a dense wavelength division multiplexing (DWDM) wavelength, for example, 1532.6 nm, 1533.4 nm, 1534.2 nm or 1535.0 nm, with an interval of 0.8 nm between adjacent wavelengths. An upstream signal is sent upstream to an optical line terminal (OLT) via an optical distribution network (ODN). Therefore, four ONUs with different wavelengths may simultaneously send a signal to the OLT, and thus no queuing is needed. A transmit burst ONU module integrates the apparatus for compensating a wavelength drift according to Embodiment 1 or 3 to stabilize the wavelength of the ONU module in the case of burst transmission, such that wavelength crosstalk between adjacent channels is prevented, and the communication quality is stabilized. Considering that the TWDM-PON is a mainstream solution of next-generation PON products, and has a huge market in the FTTH field, the wavelength drift in the case of burst transmission at the ONU end would be a commonplace issue. Therefore, the compensation method according to the embodiment of the present disclosure gains extensive application.

Embodiment 8

Figure 10:
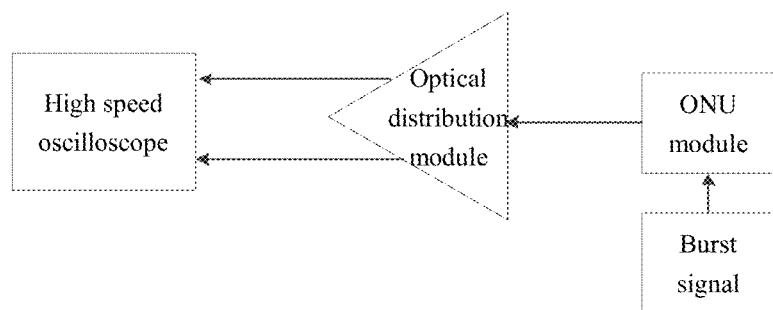
FIG. 10 is a schematic test diagram of a method for compensating for a wavelength drift according to an embodiment of the present disclosure.

The embodiment of the present disclosure further provides a test solution of wavelength drifts based on an ONU module. As illustrated in FIG. 10, the wavelength drifts of the ONU module may be more quickly and conveniently tested. An output optical signal of the ONU may enter an optical distribution module as long as a burst electrical signal is input to the ONU module, and a high speed oscilloscope samples and analyzes the waveforms to depict the drifts of the wavelength of the ONU module in a burst mode. The test solution may be used to detect wavelength drifts of different chips in the burst mode. Thus, reference may be provided for the calibrated data prestored in the MCU, and meanwhile use of the method for compensation a wavelength drift according to the present disclosure may be verified. This solution has a simple structure, and may use the conventional devices. Therefore, the solution may be simply practiced and the test result is real and reliably.

It should be noted that: since the contents such as information interaction between modules and units in the apparatus and system, and execution processes are based on the same inventive concept as method embodiments of the present disclosure, the specific content may be referenced to the description of the method embodiments of the present disclosure, which is not defined herein any further.

Persons of ordinary skill in the art may understand that all or a part of the steps in the methods according to the above embodiments may be performed by the related hardware of a terminal device which is instructed by a program. The program may be stored in a computer-readable storage medium. The storage medium may include: a read-only memory (ROM), a random access memory (RAM), a magnetic disc or an optical disc or the like.

The above described embodiments are merely preferred embodiments of the present disclosure, but are not intended to limit the present disclosure. Any modification, equivalent replacement, and improvement made without departing from the spirit and principle of the present disclosure shall fall within the protection scope of the present disclosure.

What is claimed is:

1. A method for compensating for a wavelength drift, wherein a Micro Controller Unit (MCU) stores calibrated Digit Analogy (DA) data, and the method comprises:
   generating, by a burst control circuit, a burst bias current;
   sending, by the burst control circuit, the burst bias current to a light emitting part and a trigger;
   converting, by the trigger, the received burst bias current into burst DA data;
   sending, by the trigger, the burst DA data to a synthesizer circuit;
   receiving, by the synthesizer circuit, the burst DA data sent by the trigger and the calibrated DA data sent by the MCU respectively;
   synthesizing, by the synthesizer circuit, the burst DA data and the calibrated DA data to obtain a synthesized signal;
   sending, by the synthesizer circuit, the synthesized signal to a temperature control part; and
   receiving, by the temperature control part, the synthesized signal which is output by the synthesizer circuit, and controlling a temperature of the light emitting part, such that wavelength redshift caused by burst turn-on and wavelength blueshift caused by burst turn-off are compensated.

2. The method according to claim 1, wherein the storing calibrated DA data by the MCU comprises:
   importing calibrated DA data corresponding to a laser chip of the light emitting part into the MCU, the calibrated DA data comprising one or a plurality of burst bias currents and temperature control signals corresponding to various burst bias currents.

3. The method according to claim 1, wherein the calibrated DA data is acquired by:
   connecting an output port of the light emitting part to a high speed oscilloscope;
   inputting various burst bias currents;
   and determining a wavelength drift based on a result displayed by the high speed oscilloscope; and
   recording temperature control signals corresponding to various burst bias currents based on a relationship table between wavelength drifts corresponding to a laser employed in the light emitting part and temperature compensations.

4. The method according to claim 1, wherein if the synthesized signal is expressed by a correction parameter in the calibrated DA data transferred by a data output terminal of a Complementary Metal-Oxide-Semiconductor (CMOS) switch circuit, the method further comprises:
   if a comparison parameter in the calibrated DA data is different from the burst DA data, outputting, by a comparator, a low level to a switch control electrode of the CMOS switch circuit, whereupon a CMOS switch is in a turned-off state, and a data input terminal and the data output terminal of the CMOS switch circuit are turned off; and
   if the comparison parameter in the calibrated DA data is the same as the burst DA data, outputting, by the comparator, a high level to the switch control electrode of the CMOS switch circuit, whereupon the CMOS switch is in a turned-on state and the data input terminal and the data output terminal of the CMOS switch circuit are turned on, and whereupon the calibration parameter in the calibrated DA data is transferred to the temperature control part via the data input terminal and the data output terminal of the CMOS switch circuit; wherein two input terminals of the comparator are respectively connected to an output terminal of the trigger and a first output terminal of the MCU.

5. A method for compensating for a wavelength drift, wherein a Micro Controller Unit (MCU) stores calibrated Digit Analogy (DA) data, and the method comprises:
   generating, by a burst control circuit, a burst bias current;
   sending, by a burst control circuit, the burst bias current to a light emitting part;
   receiving, by a trigger, a feedback signal from the light emitting part;
   converting, by the trigger, the feedback signal into feedback DA data;
   sending, by a trigger, the feedback DA data to a synthesizer circuit;
   receiving, by the synthesis circuit, the feedback DA data sent by the trigger and the calibrated DA data sent by the MCU respectively;
   synthesizing, by the synthesis circuit, the feedback DA data and the calibrated DA data to obtain a synthesized signal;
   sending, by the synthesis circuit, the synthesized signal to a temperature control part; and
   receiving, by the temperature control part, the synthesized signal which is output by the synthesizer circuit, and controlling a temperature of the light emitting part, such that wavelength redshift caused by burst turn-on and wavelength blueshift caused by burst turn-off are compensated.

6. The method according to claim 5, wherein the storing calibrated DA data by the MCU comprises:
   importing calibrated DA data corresponding to a laser chip of the light emitting part into the MCU, the calibrated DA data comprising one or a plurality of burst bias currents and temperature control signals corresponding to the burst bias currents.

7. The method according to claim 5, wherein the calibrated DA data is acquired by:
   connecting an output port of the light emitting part to a high speed oscilloscope;

inputting various burst bias currents, and determining a wavelength drift based on a result displayed by the high speed oscilloscope; and recording temperature control signals corresponding to various burst bias currents based on a relationship table between wavelength drifts corresponding to a laser employed in the light emitting part and temperature compensations.

8. An apparatus for compensating for a wavelength drift, comprising: a burst control circuit, a light emitting part, a Micro Controller Unit (MCU), a trigger, a synthesizer circuit and a temperature control part; wherein the burst control circuit is connected to the light emitting part, an input terminal and an output terminal of the trigger are respectively connected to the burst control circuit and the synthesizer circuit, an input terminal of the synthesizer circuit is connected to the MCU and the trigger, and an output terminal of the synthesizer circuit is connected to the temperature control part;

wherein the burst control circuit is configured to send a burst bias current to the light emitting part; the MCU is configured to store and output calibrated data; the trigger is configured to receive a burst signal and output a corresponding compensation signal under trigger of the burst signal; the synthesizer circuit is configured to synthesize calibrated Digit Analogy (DA) data and burst DA data to obtain a synthesized signal, and output the synthesized signal to the temperature control part; and the temperature control part is configured to receive an output signal upon systemization by the synthesizer circuit, and control a temperature of the light emitting part, such that wavelength redshift caused by burst turn-on and wavelength blueshift caused by burst turn-off are compensated.

9. The apparatus according to claim 8, wherein the synthesizer circuit comprises:

a comparator comprising an integrated amplifier, wherein two input terminals of the comparator are respectively connected to the output terminal of the trigger and a first output terminal of the MCU; and an output terminal of the comparator is connected to a switch control electrode of a Complementary Metal-Oxide-Semiconductor (CMOS) switch circuit, a data input terminal of the CMOS switch circuit being connected to a second output terminal of the MCU, and a data output terminal of the CMOS switch circuit being connected to the temperature control part;

wherein the first output terminal is configured to output a comparison parameter in the calibrated DA data, and the second output terminal is configured to output a correction parameter in the calibrated DA data.

10. The apparatus according to claim 8, wherein
the light emitting part is a narrowband laser for use in a dense wavelength division multiplexing (DWDM) system, wherein the light emitting part comprises a Distributed Feedback (DFB) laser, an Electro-absorption Modulated (EML) laser or a Distributed Bragg Reflector (DBR) laser.

11. The apparatus light emitting part according to claim 8, wherein the temperature control part comprises a Thermoelectric Cooler (TEC) control chip and a TEC temperature control module.

12. An apparatus for compensating for a wavelength drift, comprising: a burst control circuit, a light emitting part, a Micro Controller Unit (MCU), a trigger, a synthesizer circuit and a temperature control part; wherein the burst control circuit is connected to the light emitting part, an input terminal and an output terminal of the trigger are respectively connected to the light emitting part and the synthesizer circuit, an input terminal of the synthesizer circuit is connected to the MCU and the trigger, and an output terminal of the synthesizer circuit is connected to the temperature control part;

wherein the burst control circuit is configured to send a burst bias current to the light emitting part; the MCU is configured to store and output calibrated data; a backlight feedback circuit of the light emitting part forms a burst feedback signal, wherein a feedback rising edge signal or falling edge signal is input to the trigger; the trigger is configured to convert the feedback signal into feedback Digit Analogy (DA) data; the synthesizer circuit is configured to synthesize calibrated DA data and feedback DA data to obtain a synthesized signal, and output the synthesized signal to the temperature control part; and the temperature control part is configured to receive an output signal upon systemization by the synthesizer circuit, and control a temperature of the light emitting part, such that wavelength redshift caused by burst turn-on and wavelength blueshift caused by burst turn-off are compensated.

13. The apparatus for compensating for a wavelength drift according to claim 12, wherein the synthesizer circuit comprises:

a comparator constituted by an integrated amplifier, wherein two input terminals of the comparator are respectively connected to the output terminal of the trigger and a first output terminal of the MCU; and an output terminal of the comparator is connected to a switch control electrode of a Complementary Metal-Oxide-Semiconductor (CMOS) switch circuit, a data input terminal of the CMOS switch circuit being connected to a second output terminal of the MCU, and a data output terminal of the CMOS switch circuit being connected to the temperature control part;

wherein the first output terminal is configured to output a comparison parameter in the calibrated DA data, and the second output terminal is configured to output a correction parameter in the calibrated DA data.

14. The apparatus for compensating for a wavelength drift according to claim 12, wherein
the light emitting part is a narrowband laser for use in a dense wavelength division multiplexing (DWDM) system, comprising a Distributed Feedback (DFB) laser, an Electro-absorption Modulated (EML) laser or a Distributed Bragg Reflector (DBR) laser.

15. The apparatus for compensating for a wavelength drift according to claim 12, wherein the temperature control part comprises a Thermoelectric Cooler (TEC) control chip and a TEC temperature control module.

* * * * *